United States Patent
Kong et al.

(10) Patent No.: US 10,972,095 B2
(45) Date of Patent: Apr. 6, 2021

(54) PULSE WIDTH MODULATION BUCK CONVERTER

(71) Applicant: Research & Business Foundation Sungkyunkwan University, Suwon-si (KR)

(72) Inventors: Bai Sun Kong, Suwon-si (KR); Jung Duk Suh, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/914,739

(22) Filed: Jun. 29, 2020

(65) Prior Publication Data

US 2021/0006245 A1 Jan. 7, 2021

(30) Foreign Application Priority Data

Jul. 2, 2019 (KR) .......................... 10-2019-0079546

(51) Int. Cl.
| | |
|---|---|
| *H02M 1/00* | (2006.01) |
| *H02M 3/04* | (2006.01) |
| *H02M 3/156* | (2006.01) |
| *H02M 3/158* | (2006.01) |
| *G05F 1/24* | (2006.01) |
| *H03K 17/687* | (2006.01) |

(Continued)

(52) U.S. Cl.
CPC .......... *H03K 17/6871* (2013.01); *H02M 1/08* (2013.01); *H02M 3/158* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 6,686,729 B1 | 2/2004 | Kawamura et al. | |
| 9,735,678 B2 * | 8/2017 | Childs ................... | H02M 3/158 |

(Continued)

FOREIGN PATENT DOCUMENTS

| | | |
|---|---|---|
| KR | 10-2017-0143221 | 12/2017 |
| KR | 10-1829346 | 2/2018 |
| KR | 10-1829346 B1 | 2/2018 |

OTHER PUBLICATIONS

Korean Office Action dated Dec. 14, 2020 in corresponding Korean Patent Application No. 10-2019-0079546 (5 pages in Korean).

*Primary Examiner* — Kenneth B Wells
(74) *Attorney, Agent, or Firm* — NSIP Law

(57) ABSTRACT

A PWM buck converter includes a first P-type transistor having a drain terminal connected to a first node, a first N-type transistor having a drain terminal connected to the first node, and a gate driver configured to apply a first gate voltage to a first gate terminal of the first P-type transistor and apply a second gate voltage to a second gate terminal of the first N-type transistor. The gate driver includes a first buffer configured to generate the first gate voltage applied to the gate terminal of the first P-type transistor, a second buffer configured to generate the second gate voltage applied to the gate terminal of the first N-type transistor, and a capacitor configured to accumulate a portion of electrical charges supplied from the first buffer to the first P-type transistor, and supply the accumulated electrical charges to the gate terminal of the first N-type transistor.

10 Claims, 12 Drawing Sheets

(51) Int. Cl.
*H03K 7/08* (2006.01)
*H02M 1/08* (2006.01)

(56) References Cited

U.S. PATENT DOCUMENTS

| | | | | |
|---|---|---|---|---|
| 2012/0007572 A1* | 1/2012 | Oddoart | .............. | H02M 3/1588 323/282 |
| 2014/0002049 A1* | 1/2014 | Schrom | ............... | H02M 3/1588 323/311 |

* cited by examiner

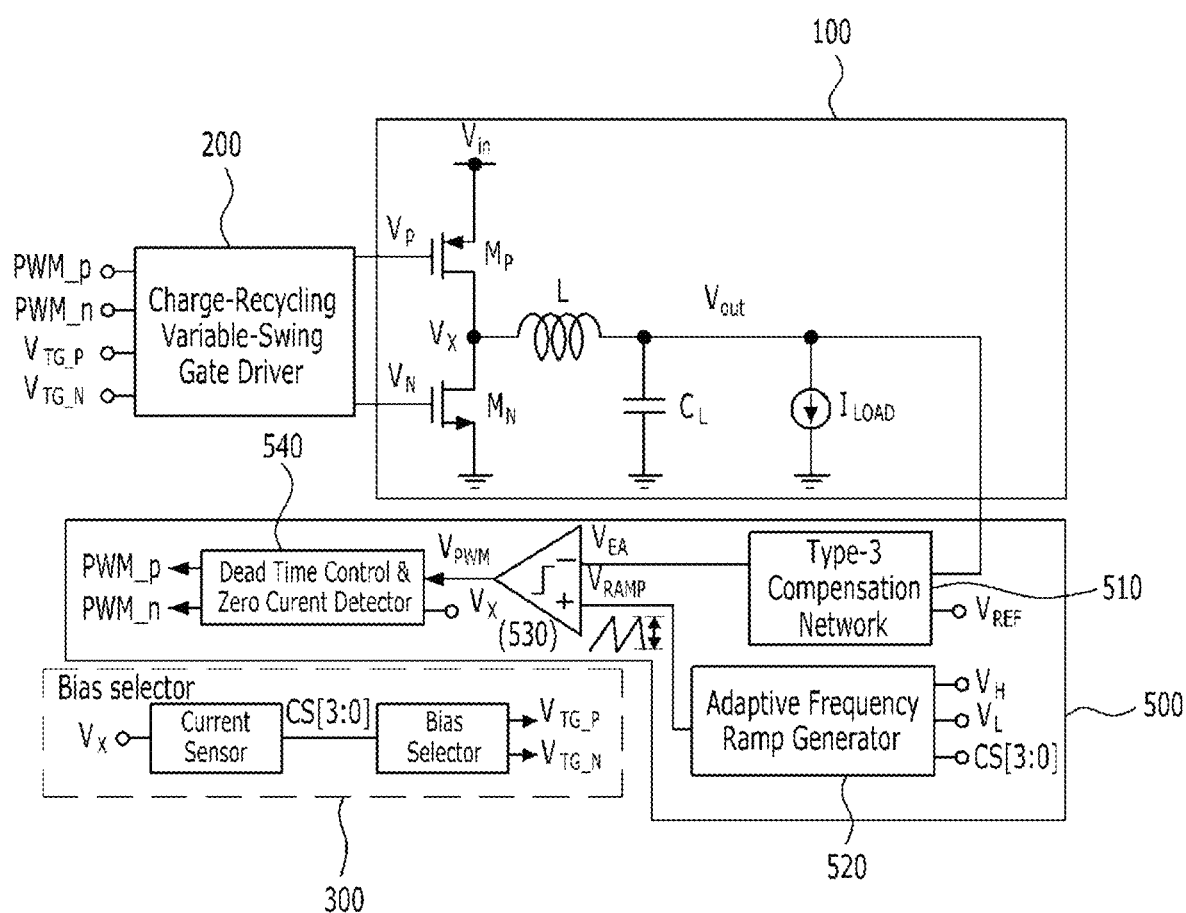
[FIG. 1]

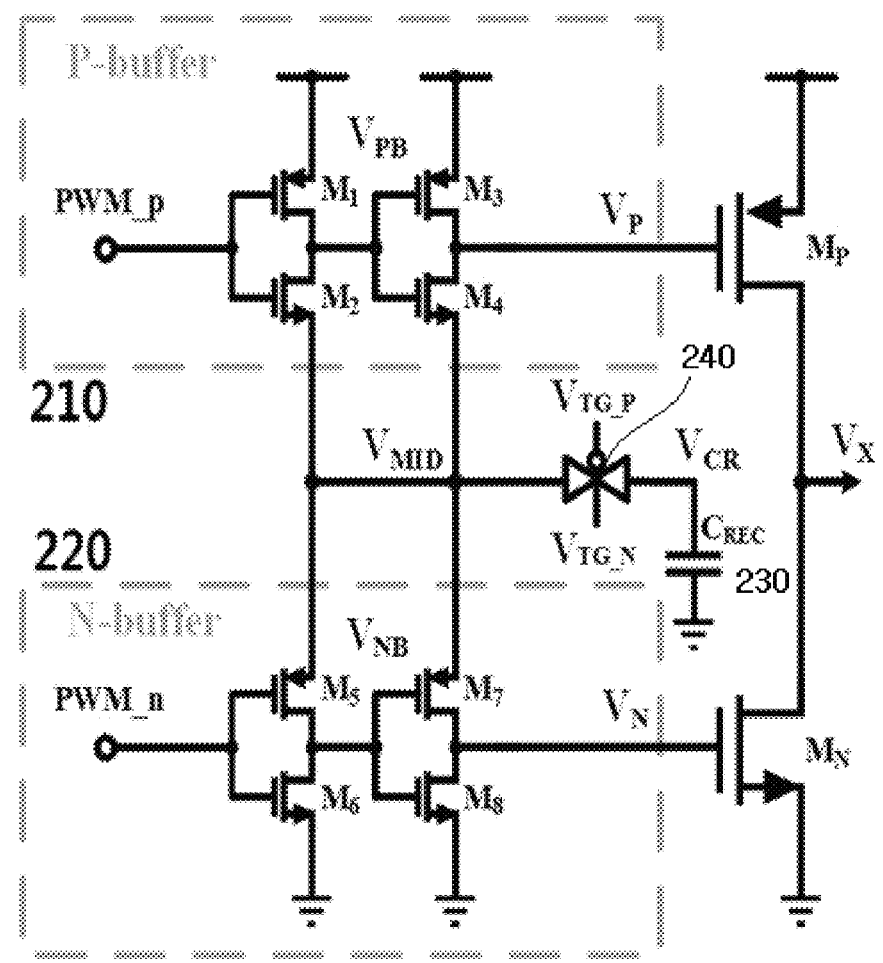
[FIG. 2]

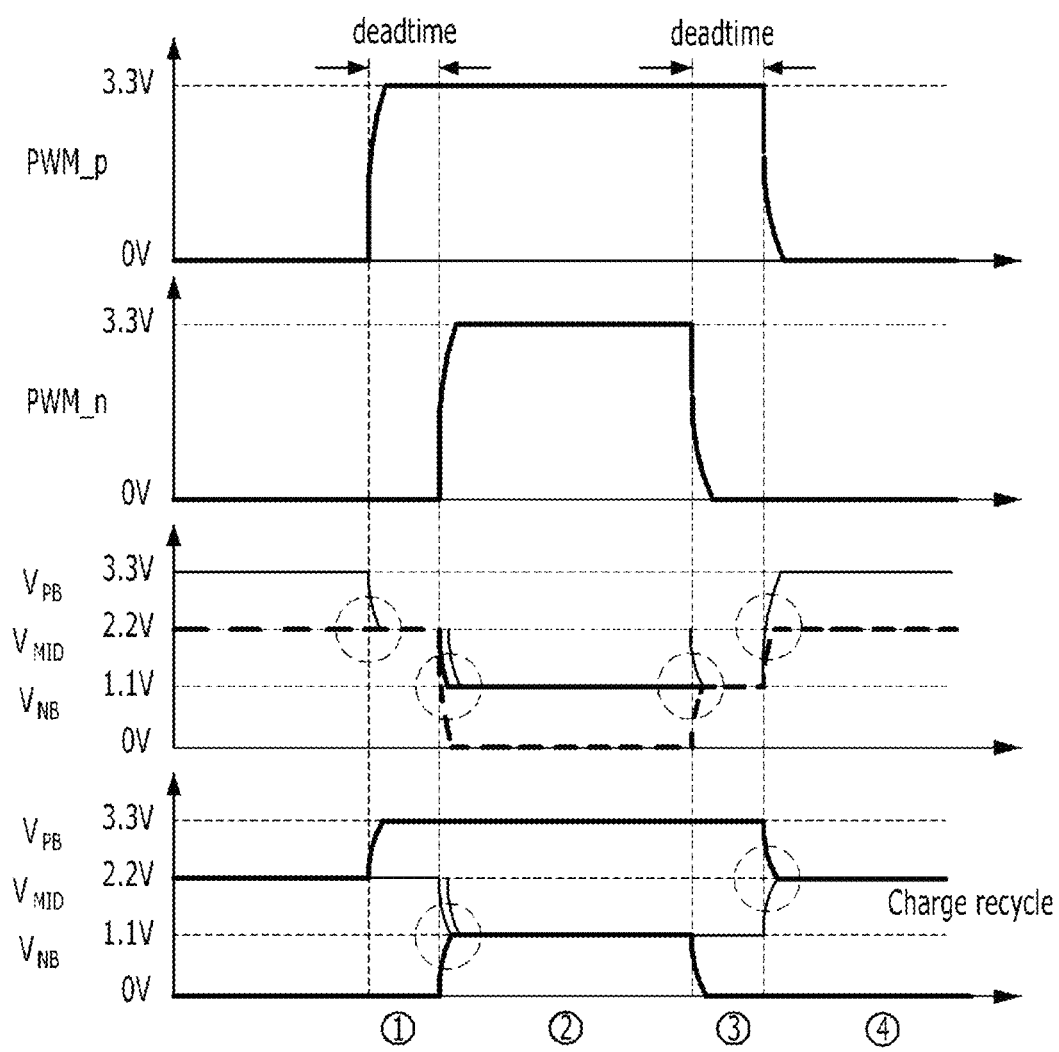
[FIG. 3]

[FIG. 4A]
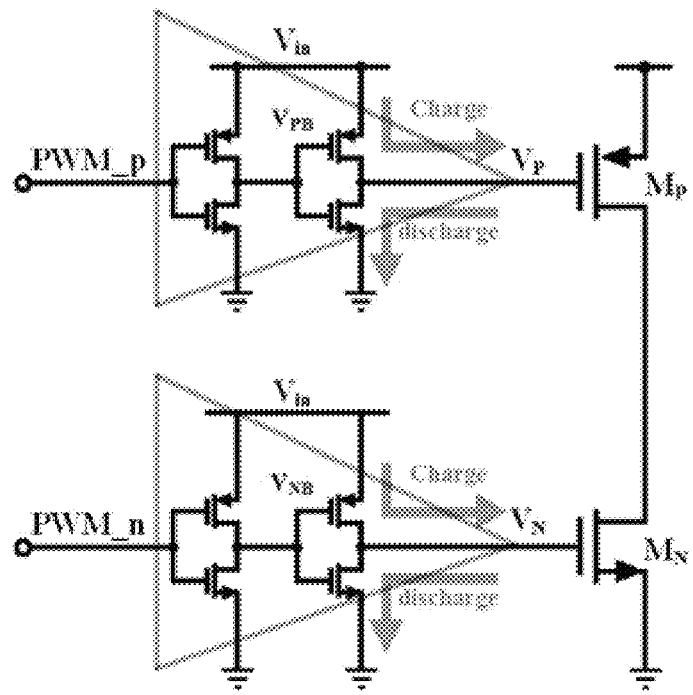
[FIG. 4B]
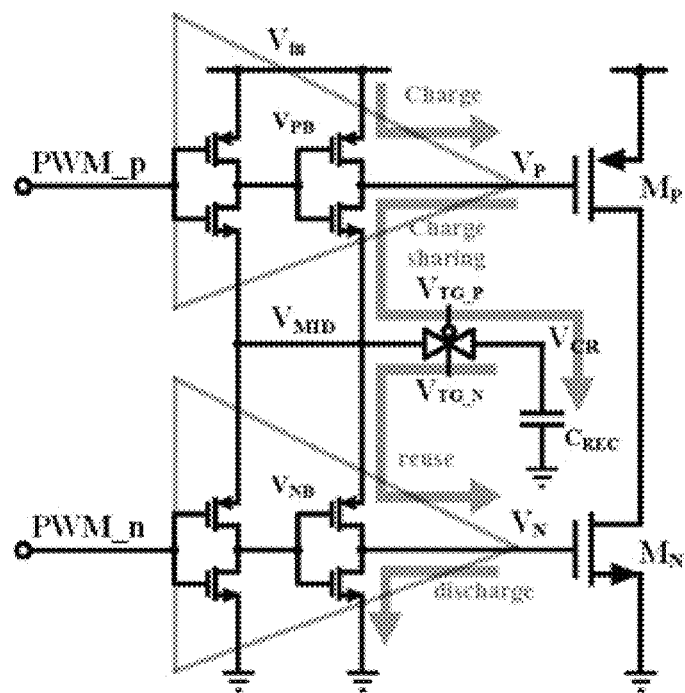

[FIG. 5]
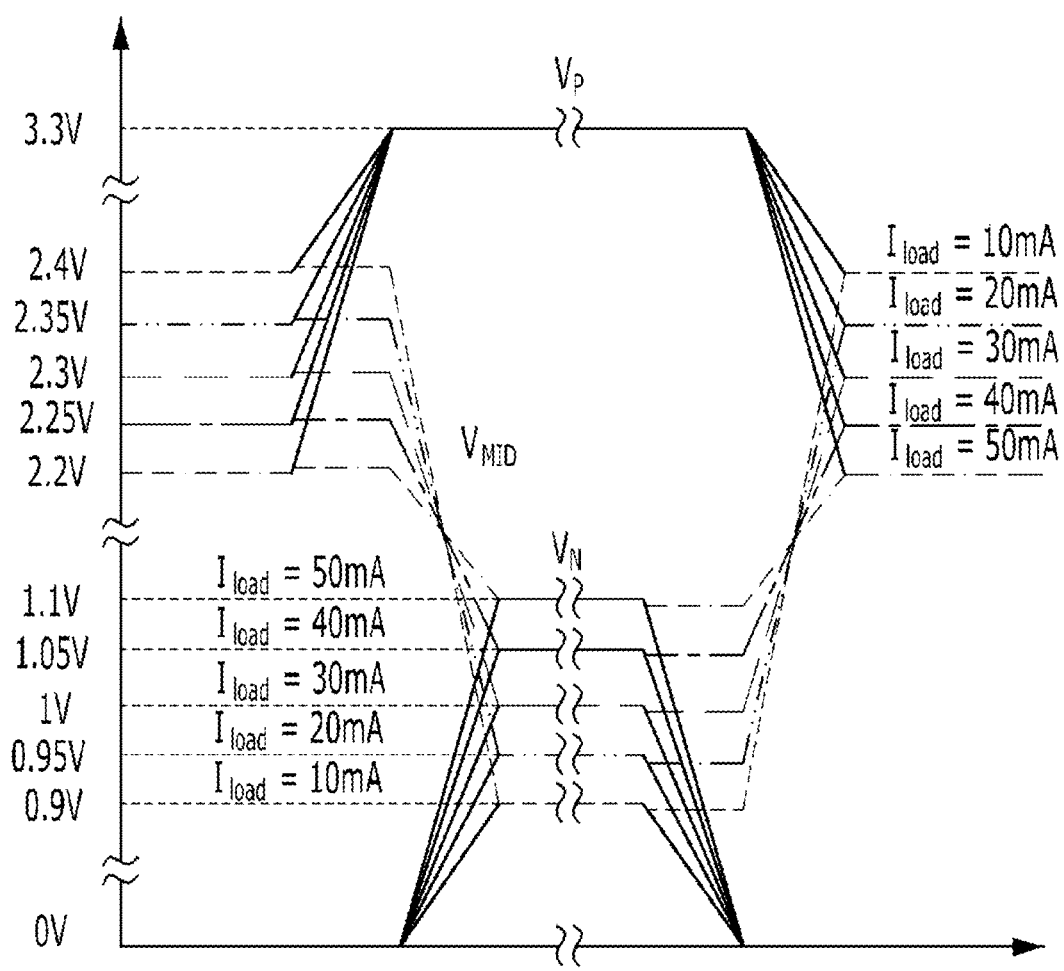

[FIG. 6A]
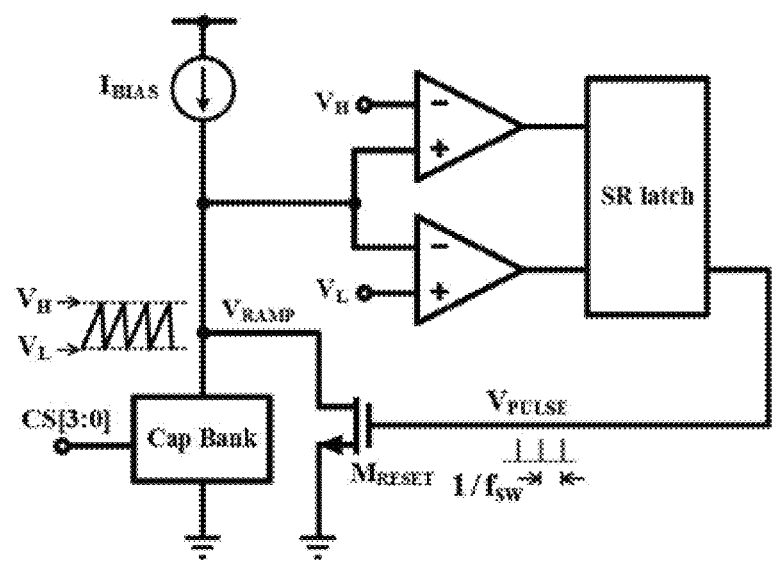
[FIG. 6B]
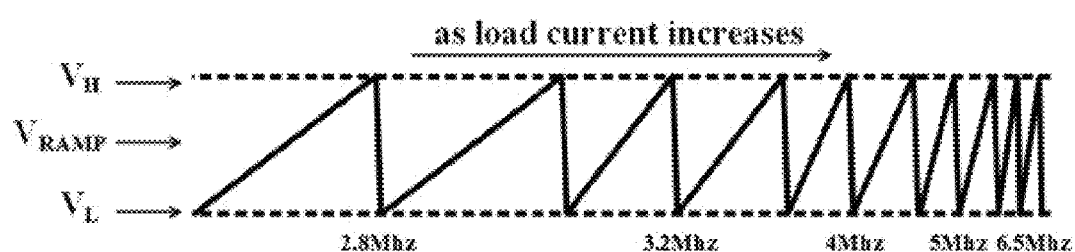

[FIG. 7A]
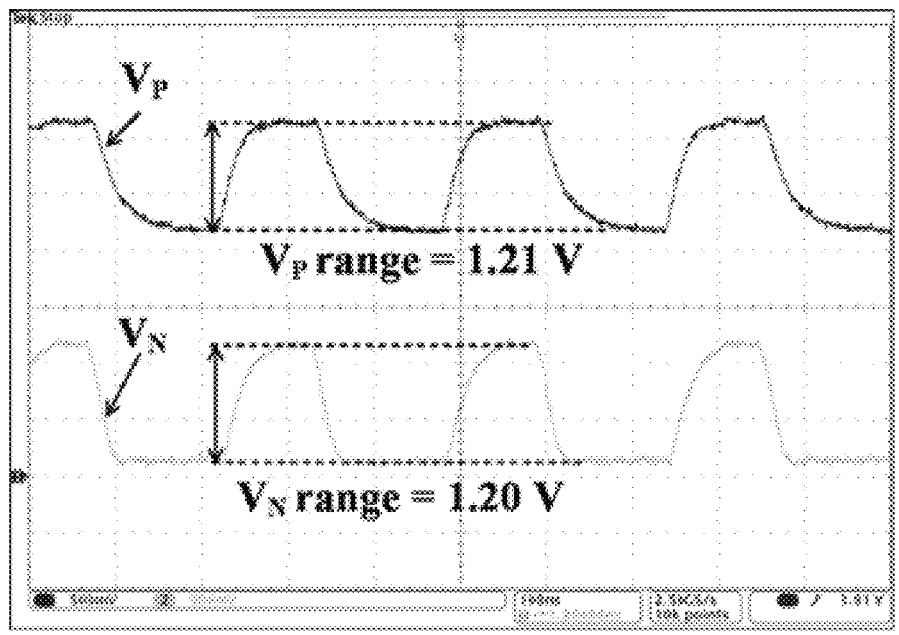
[FIG. 7B]
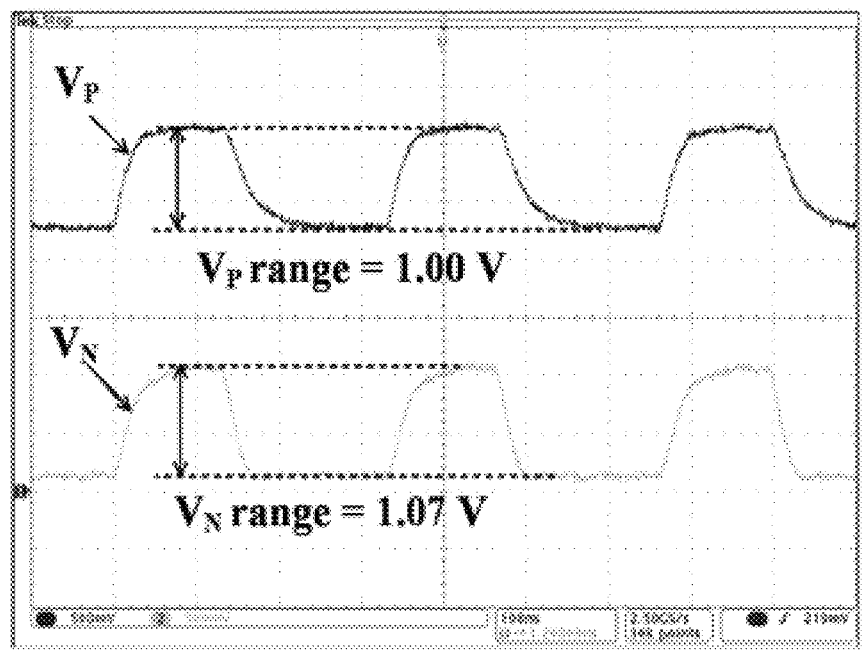

[FIG. 7C]
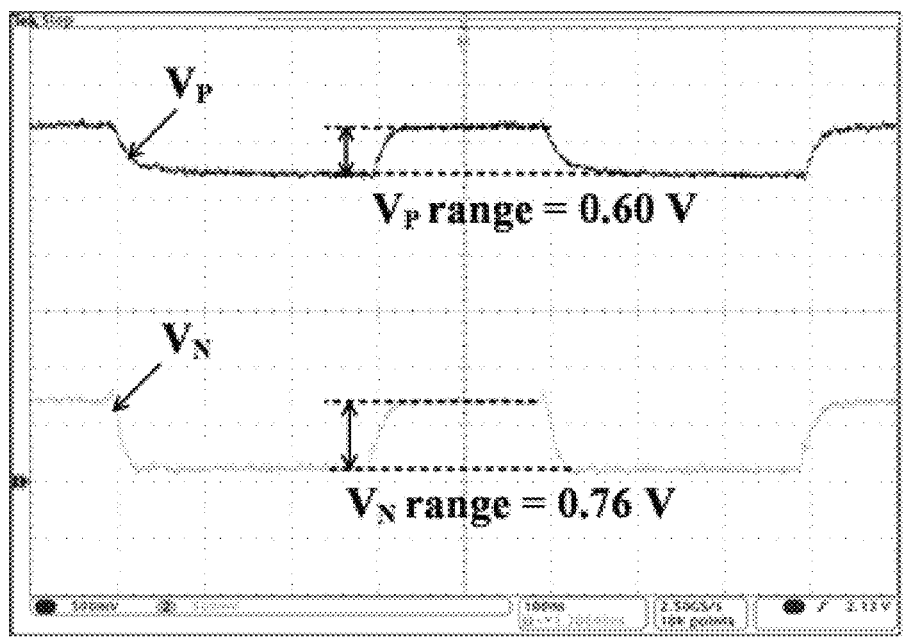

[FIG. 8A]
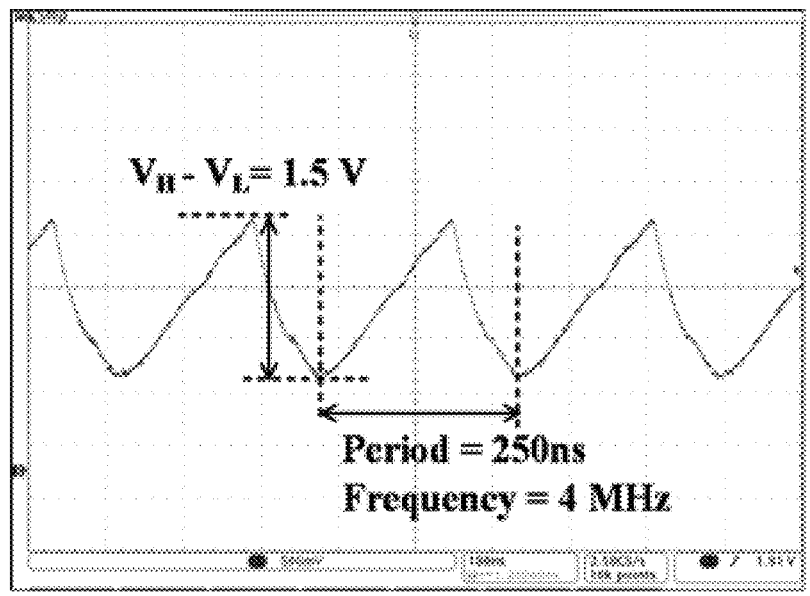
[FIG. 8B]
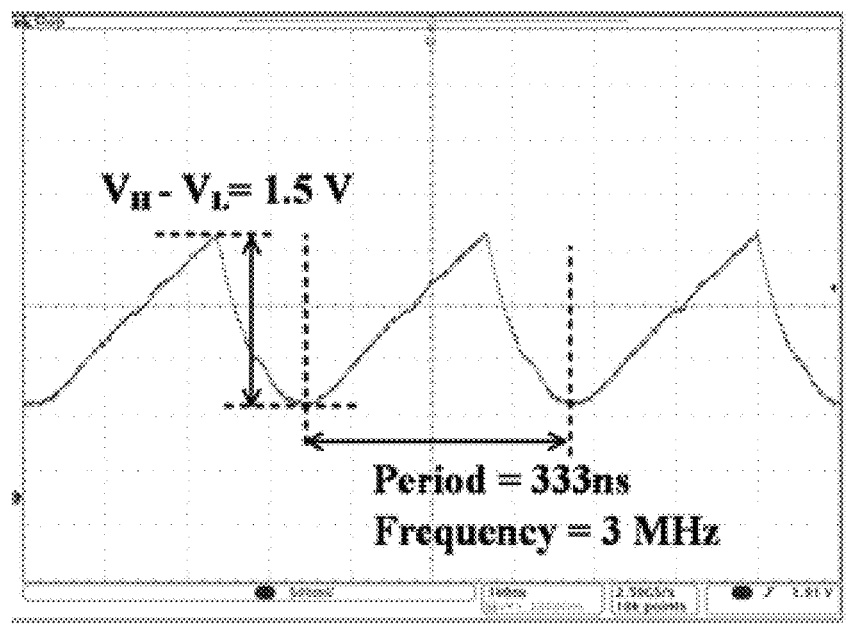

[FIG. 8C]
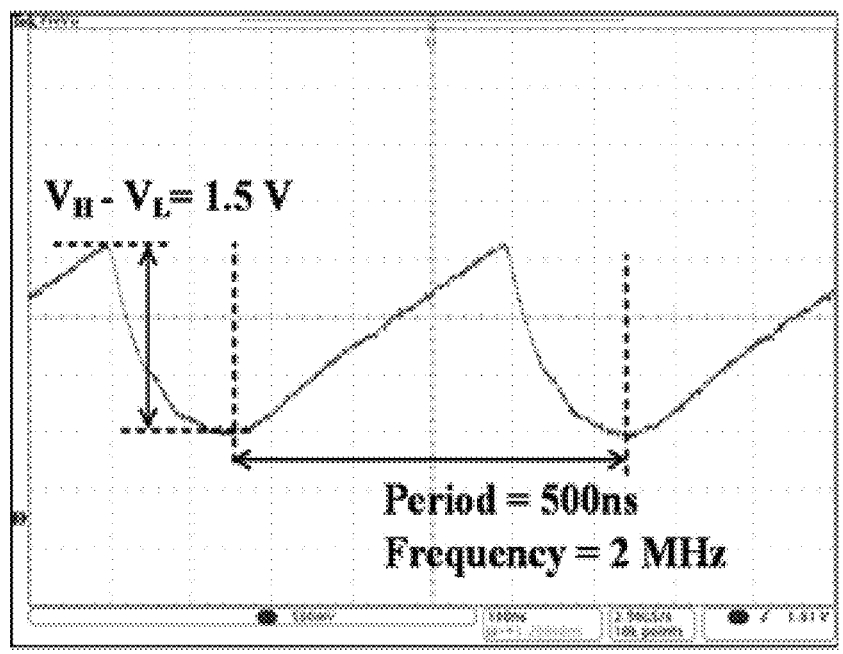

[FIG. 9]
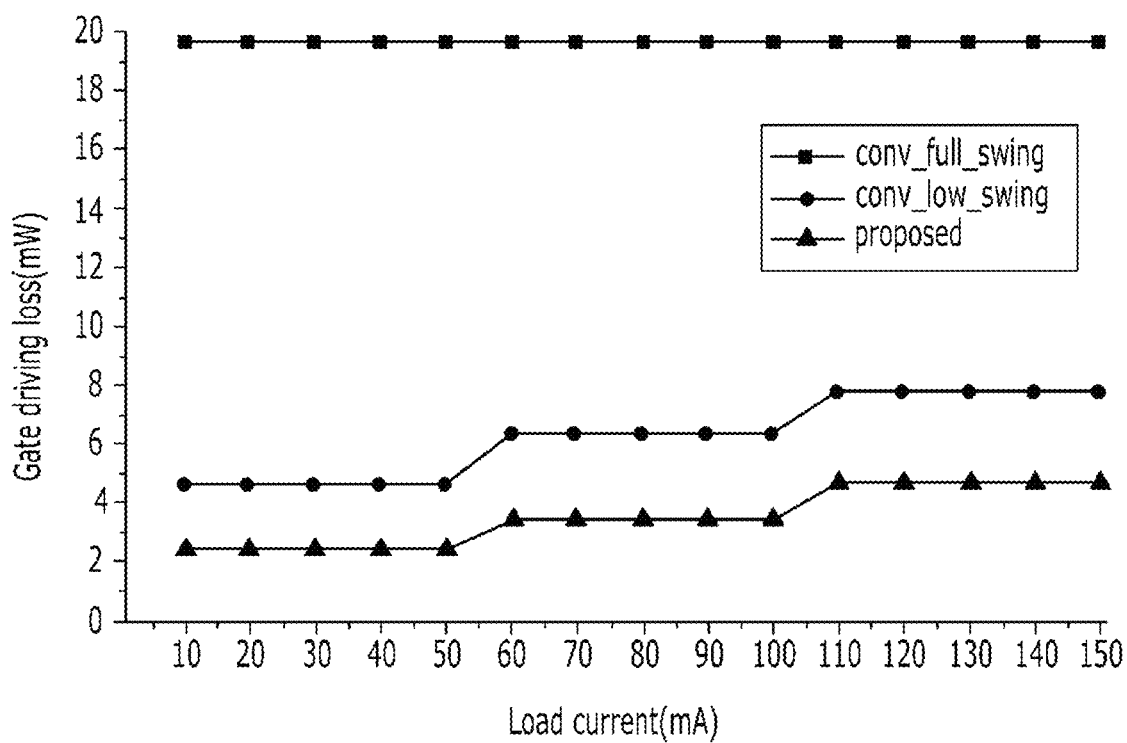

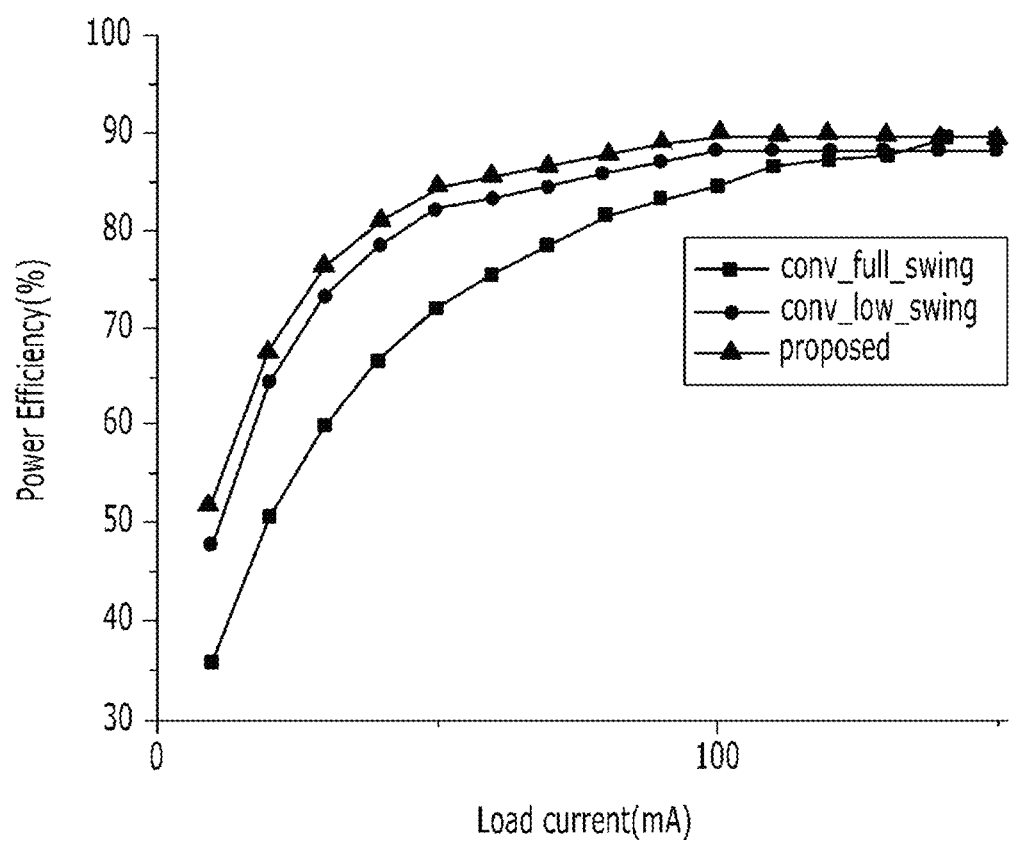
[FIG. 10]

PULSE WIDTH MODULATION BUCK CONVERTER

CROSS-REFERENCE TO RELATED APPLICATIONS

This application claims the benefit under 35 USC 119(a) of Korean Patent Application No. 10-2019-0079546 filed on Jul. 2, 2019, in the Korean Intellectual Property Office, the entire disclosure of which is incorporated herein by reference for all purposes.

BACKGROUND

1. Field

The present disclosure relates to a pulse width modulation (PWM) buck converter.

2. Description of the Related Art

Losses generated in a typical PWM buck converter are largely classified into a switching loss and a conduction loss. A characteristic of a typical buck converter is to become less efficient as load current decreases. In a light load condition in which a load current is low, switching losses are dominant; thus, there's a desire to reduce the switching losses.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a PWM buck converter includes a first P-type transistor, a first N-type transistor, and a gate driver. The first P-type transistor has a drain terminal connected to a first node. The first N-type transistor has a drain terminal connected to the first node. The gate driver is configured to apply a first gate voltage to a first gate terminal of the first P-type transistor and apply a second gate voltage to a second gate terminal of the first N-type transistor. The gate driver includes a first buffer configured to generate the first gate voltage applied to the gate terminal of the first P-type transistor, a second buffer configured to generate the second gate voltage applied to the gate terminal of the first N-type transistor, and a capacitor, disposed between the first buffer and the second buffer, configured to accumulate a portion of electrical charges supplied from the first buffer to the first P-type transistor, and supply the accumulated electrical charges to the gate terminal of the first N-type transistor.

The capacitor may be a recycle capacitor.

The gate driver may further include a transmission gate, disposed between the first buffer and the second buffer, configured to adjust a quantity of charged or discharged electrical charges of the capacitor.

The PWM buck converter may further include a bias selector configured to set and select bias voltages ($V_{TG\_P}$ and $V_{TG\_N}$) applied to the transmission gate, and a PWM signal generator configured to generate and input a first PWM signal ($PWM\_p$) and a second PWM signal ($PWM\_n$) to the first buffer and the second buffer, respectively.

When a voltage of the first PWM signal ($PWM\_p$) of the first buffer rises, a first switch ($M_1$) and a second switch ($M_2$) of the first buffer may be turned off and turned on, respectively, and a voltage of an internal node ($V_{PB}$) of the first buffer may drop to turn on and turn off a third switch ($M_3$) and a fourth switch ($M_4$) of the first buffer, respectively, to turn off a first power switch ($M_P$).

When a voltage of the second PWM signal ($PWM\_n$) of the second buffer rises, a fifth switch ($M_5$) and a sixth switch ($M_6$) of the second buffer may be turned off and turned on, respectively, and a voltage of an internal node ($V_{NB}$) of the second buffer may be shifted to 0 V to turn on and turn off a seventh switch ($M_7$) and an eighth switch ($M_8$) of the second buffer, respectively, to turn on a second power switch ($M_N$).

Electrical charges stored in the capacitor may be recycled to drive the second power switch ($M_N$) so that an output ($V_N$) of the second buffer rises a voltage of 0 V to a voltage of an intermediate node ($V_{MID}$) of the first and second buffers.

When a voltage of the first PWM signal ($PWM\_p$) of the first buffer drops, a first switch ($M_1$) and a second switch ($M_2$) of the first buffer may be turned on and turned off, respectively, and a voltage of an internal node ($V_{PB}$) of the first buffer may rise to turn off and turn on a third switch ($M_3$) and a fourth switch ($M_4$) of the first buffer, respectively, to turn on a first power switch ($M_P$).

When a voltage of the second PWM signal ($PWM\_n$) of the second buffer drops, a fifth switch ($M_5$) and a sixth switch ($M_6$) of the second buffer may be turned on and turned off, respectively, and a voltage of an internal node ($V_{NB}$) of the second buffer may be increased to turn off and turn on a seventh switch ($M_7$) and an eighth switch ($M_8$) of the second buffer, respectively, to turn off a second power switch ($M_N$).

The PWM buck converter wherein quantity of charges used for one cycle of the gate driver is $$Q_{total\_prop} = Q_{P\_prop} + Q_{P\_prop} \approx \frac{1}{3} C_{GP} V_{in}.$$

Other features and aspects will be apparent from the following detailed description, the drawings, and the claims.

BRIEF DESCRIPTION OF THE DRAWINGS

FIG. 1 is a structural diagram of an example of a pulse width modulation (PWM) buck converter.

FIG. 2 is a structural diagram of an example of a gate driver of a PWM buck converter.

FIG. 3 is an operation waveform of an example of a gate driver.

FIGS. 4A and 4B are views comparing energy consumption efficiency of operations of a conventional full swing driver and an example of a gate driver, respectively.

FIG. 5 is a view illustrating an example of an operation waveform for a gate voltage of a power switch based on a load current.

FIGS. 6A and 6B illustrate a circuit of an example of a frequency adjustable ramp generator and a waveform change based on a current, respectively.

FIG. 7A to FIG. 7C are views illustrating an example of a measurement waveform of a power MOSFET gate voltage swing based on a load current.

FIG. 8A to FIG. 8C are views illustrating examples of ramp measurement waveforms based on a load current.

FIG. 9 is a graph of a measurement result of a gate driving loss of a conventional circuit and an example of a proposed circuit based on a current change.

FIG. 10 is a graph of an efficiency measurement result of a conventional full swing, conventional low swing, and an example of a proposed circuit based on a current.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure relates to a pulse width modulation (PWM) buck converter capable of reusing charges by adjusting a swing width to reduce a gate driving loss which takes a most part of the losses in a light load and achieve a high efficiency.

An object of the present disclosure is to provide a PWM buck converter which improves an efficiency by reducing a switching loss in a light load condition of the PWM buck converter of the related art and reduces a gate driving loss by a charge-recycling variable-swing gate driver because the gate driving loss generated in a gate driver which drives a power switching takes a largest part among switching losses.

A PWM buck converter 10 according to the present disclosure, also called charge-recycling gate-voltage swing control, includes a voltage converter 100, a gate driver 200, a bias selector 300, and a PWM signal generator 500, as illustrated in FIG. 1.

Among the above-mentioned components, sub components of the gate driver 200, the bias selector 300, and the PWM signal generator have characteristics and the other components, except for the corresponding components, are described in detail in Korean Registered Patent Publication No. 10-1829346 (Feb. 8, 2018) which has been previously filed by the inventor of the present disclosure are incorporated in its entirety. Redundant description may be omitted.

FIG. 2 is a detailed structural diagram of an example of a gate driver 200, which may be a characteristic component of a PWM buck converter. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

As illustrated in FIG. 2, the gate driver 200 includes a first buffer (P-buffer) 210, a second buffer (N-buffer) 220, a recycle capacitor ($C_{REC}$: Charge-recycling capacitor) 230, and a transmission gate 240.

The gate driver 200 recycles charges used in a gate capacitor of $M_P$ to charge a gate capacitor of $M_N$.

Bias voltages $V_{TG\_P}$ and $V_{TG\_N}$ used for the transmission gate 240 may be adjusted to be used as variable resistors.

The bias voltages may be adjusted to adjust a gate voltage swing value of a power switch.

A circuit of the gate driver 200 of the present disclosure may be designed using transistors of the same size, such that a gate capacitor of $M_N$ has the same size as a gate capacitor of $M_P$, and a size of the recycle capacitor $C_{REC}$ 230 has the same size as a gate capacitor of the power switch.

FIG. 3 illustrates an example of an operation waveform of the gate driver 200.

A first PWM signal $PWM_{\_P}$ and a second PWM signal $PWM_{\_N}$ generated in the PWM signal generator 500 may be input signals of a first buffer 210 and a second buffer 220.

$V_{PB}$ and $V_{PN}$ are internal nodes of the first buffer 210 and the second buffer 220. VIM is an intermediate node of two buffers, and $V_{CR}$ is a node of the recycle capacitor 230.

$V_P$ and $V_N$ are outputs of the first buffer 210 and the second buffer 220 used to drive a first power switch $M_P$ and a second power switch $M_N$, respectively.

First, in order to describe charge recycling, it may be assumed that bias voltages $V_{TG\_P}$ and $V_{TG\_N}$ of the transmission gate 240, which connect $V_{MID}$ and $V_{CR}$ are set to be 0 V and 3.3 V, respectively, in a non-limiting example.

Therefore, the transmission gate 240 is fully turned on, and $V_{MID}$ and $V_{CR}$ have the same voltage level and an initial value assumed to be 2.2 V (a change based on a bias voltage will be additionally described in FIGS. 4A and 4B).

When the first PWM signal $PWM_{\_P}$ rises from 0 V to 3.3 V (① of FIG. 3), $M_1$ and $M_2$ in the first buffer 210 are turned off and turned on, respectively. Thereafter, a parasitic capacitance of $V_{PB}$ is much smaller than a sum of a parasitic capacitance of $V_{MID}$ and the recycle capacitor $C_{REC}$ 230, so that the voltage of $V_{PB}$ has the same value as the voltages of $V_{MID}$ and $V_{CR}$.

Thus, the charges used in $V_{PB}$ are stored in the recycle capacitor OPEC 230 without being sank to the ground.

Next, $V_{PB}$ drops from 3.3 V to 2.2 V, and thus $M_3$ is turned on, and $M_4$ is turned off. Therefore, an output $V_P$ of the first buffer 210 is 3.3 V so that the power switch $M_P$ is turned off.

Next, when the second PWM signal $PWM_{\_n}$ rises from 0 V to 3.3 V (② of FIG. 3), $M_5$ and $M_6$ in the second buffer 220 are turned off and turned on, respectively. Therefore, $V_{NB}$ is 0 V so that $M_7$ is turned on and $M_5$ is turned off.

Thereafter, the output $V_N$ of the second buffer 220 rises to the voltage of $V_{MID}$ from 0.

This means that the charges stored in the recycle capacitor $C_{REC}$ 230 are recycled to drive the power switch $M_N$. In order to determine a final voltage of $V_N$, the change from ① to ② will be explained by a charge conservation law.

$$Q = (C_{REC} + C_{MID} + C_{PB})V_{CR} \quad \text{Equation 1}$$
$$= (C_{GN} + C_{REC} + C_{MID} + C_{PB})V_N$$

In Equation 1, $C_{PB}$ is a gate capacitance of a last stage of the first buffer 210, $C_{MID}$ is a parasitic capacitance of $V_{MID}$, and $C_{GN}$ is a gate capacitance of $M_N$. When Equation is summarized, V is expressed by the following Equation 2.

$$V_N = \frac{(C_{REC} + C_{MID} + C_{PB})V_{CR}}{C_{GN} + C_{REC} + C_{MID} + C_{PB}} \quad \text{Equation 2}$$

A gate capacitance $C_{GN}$ of the power switch is much higher than a gate capacitance $C_{PB}$ of the buffer ($C_{GN} \gg C_{PB}$) and a value of the recycle capacitor $C_{REC}$ is much larger than parasitic capacitances of $V_{MID}$ and $V_{PB}$ ($C_{REC} \gg C_{MID}$). Therefore, $V_N$ may be briefly expressed by the following Equation 3.

$$V_N \approx \frac{C_{REC}}{C_{GN} + C_{REC}} V_{CR} \quad \text{Equation 3}$$

From Equation 3, when the gate capacitance $C_{GN}$ is the same as the magnitude of the recycle capacitor $C_{REC}$ and $V_{CR}$ is 2.2 V, a voltage of $V_N$ and $V_{MID}$ is 1.1 V. When the second PWM signal $PWM_{\_n}$ is reduced to 0 V from 3.3 V (③ of FIG. 3), $M_5$ is turned on, and $M_6$ is turned off.

The parasitic capacitance of $V_{NB}$ is much lower than the recycle capacitor $C_{REC}$, so that the voltage of $V_{NB}$ follows voltages of $V_{MID}$ and $C_{REC}$. Therefore, the stored charge $C_{REC}$ is recycled to drive the second buffer 220.

Thereafter, $V_{NB}$ increases to 1.1 V from 0 V, so that $M_7$ is turned off, and $M_8$ is turned on. As a result, an output $V_N$ of the second buffer 220 is 0 V so that the power switch $M_N$ is turned off.

Thereafter, when the first PWM signal $PWM_{\_P}$ drops to 0 V from 3.3 V (④ of FIG. 2), $M_1$ is turned on, and $M_2$ is turned off. Therefore, $V_{PB}$ is 3.3 V so that $M_3$ is turned off, and $M_4$ is turned on.

By doing this, the output of the first buffer 210 drops to $V_{MID}$ from 3.3 V. Thus, the charges used in $C_{GP}$ are recycled in the recycle capacitor $C_{REC}$ 230 without being sank to the ground. Similar to the above-described method, it may be explained by a charge conservation law (from ③ of FIG. 3 to ④ of FIG. 3).

$$Q = C_{GP}V_{in} + (C_{REC} + C_{MID} + C_{PB})V_{CR} \quad \text{Equation 4}$$
$$= (C_{GP} + C_{REC} + C_{MID} + C_{NB})V_P$$

In Equation 4, $C_{NB}$ represents a gate capacitance of a last stage of the second buffer 220. When Equation 4 is summarized, $V_P$ may be represented by the following Equation 5.

$$V_P = \frac{C_{GP}V_{in} + (C_{REC} + C_{MID} + C_{NB})V_N}{C_{GN} + C_{REC} + C_{MID} + C_{NB}} \quad \text{Equation 5}$$

$C_{PB}$, $C_{NB}$, and $C_{MID}$ are much smaller than $C_{GP}$, $C_{GN}$, and $C_{REC}$, so that $C_{PB}$, $C_{NB}$, and $C_{MID}$ are ignored and the following Equation 6 is established.

$$V_P \approx \frac{C_{GP}V_{in} + C_{REC}V_N}{C_{GP} + C_{REC}} \quad \text{Equation 6}$$

In an example, in the gate driver 200 circuit, magnitudes of $C_{GP}$ and $C_{REC}$ are the same. $V_N$ is 1.1 V and $V_{in}$ is 3.3 V in ③ of FIG. 3, so that $V_P$ and $V_{CR}$ are determined to be 2.2 V by Equation 6. That is, $V_P(V_N)$ swings from 2.2 V to 3.3 V (from 0 V to 1.1 V) and $V_{CR}$ swings from 2.2 V to 3.3 V. Therefore, $V_{PB}$ ($V_{NB}$) swings at 1.1 V to 3.3 V (0 V to 2.2 V).

FIGS. 4A and 4B are views comparing energy consumption efficiency of operations of a conventional full swing driver and an example of a gate driver, respectively. A quantity of charges used for one cycle of the conventional driver is represented by the following Equations 7 and 8.

$$Q_{P\_fullswing} = C_{GP}(V_{in} - 0) + C_{PB}(V_{in} - 0) \quad \text{Equation 7}$$
$$= C_{GP}V_{in} + C_{PB}V_{in}$$

$$Q_{N\_fullswing} = C_{GN}(V_{in} - 0) + C_{NB}(V_{in} - 0) \quad \text{Equation 8}$$
$$= C_{GN}V_{in} + C_{NB}V_{in}.$$

In the conventional circuit, a ratio of PMOS and NMOS is 2:1 so that a gate capacitance of the power switch may be represented by the following Equation 9.

$$C_{GP} = 2C_{GN} \quad \text{Equation 9:}$$

Therefore, the entire quantity of charges of the driver of the related art is summarized as represented by the following Equation 10.

$$Q_{total\_fullswing} = \quad \text{Equation 10}$$
$$Q_{P\_fullswing} + Q_{N\_fullswing} \approx C_{GP}V_{in} + C_{GN}V_{in} = \frac{3}{2}C_{GP}V_{in}.$$

In the meantime, a quantity of charges used for one cycle of a gate driver of the present disclosure is represented by the following Equation 11.

$$Q_{P\_prop} = C_{GP}\left(V_{in} - \frac{2}{3}V_{in}\right) + C_{PB}\left(V_{in} - \frac{1}{3}V_{in}\right) \quad \text{Equation 11}$$
$$= \frac{1}{3}C_{GP}V_{in} + \frac{2}{3}C_{PB}V_{in}$$

$$Q_{N\_prop} = 0 \quad \text{Equation 12}$$

Since charges used by the first buffer 210 are recycled by the second buffer 220, according to the method of the present disclosure, only charges for the first buffer 210 stages are required. Therefore, the quantity of charges used for the gate driver according to one or more examples are represented by the following Equation 13.

$$Q_{total\_prop} = Q_{P\_prop} + Q_{P\_prop} \approx \frac{1}{3}C_{GP}V_{in} \quad \text{Equation 13}$$

As seen from Equations 10 and 13, it may understood that a total quantity of charges used by the gate driver, according to one or more examples, to switch a power transistor is reduced by 77.8% as compared with a conventional full swing driver.

FIG. 5 is a view illustrating an example of an operation waveform for a gate voltage of a power switch based on a load current. A method for reducing a swing width is a method for reducing a gate driving loss.

However, when the swing width is reduced, an on-resistance of the power switch is increased so that a conduction loss is increased. Therefore, in order to increase a total efficiency, there is an optimal gate voltage of a power switch based on a load current.

Since the smaller the load, the less the conduction loss and the less the switching loss, the entire efficiency is increased by providing a smaller gate voltage swing. Therefore, the gate driver according to the present disclosure proposes a method in which the lower the load current, the smaller the swing width. In order to provide a variable gate voltage swing by the gate driver illustrated in FIG. 2, for example, voltage levels of a first transmission gate voltage $V_{TG\_P}$ and a second transmission gate voltage $V_{TG\_N}$ of the transmission gate may need to be adjusted.

The bias voltage detects a load current to generate 4-bit thermometer code (CS[3:0]) based on the load current and determines a bias voltage by a bias selector 300 using the generated code.

In this circuit example, light (very light) load condition is defined when a load current is lower than 100 mA (50 mA). When the load current is a heavy load current, $V_{TG\_P}$ and $V_{TG\_N}$ are selected to be 0 V and 3.3 V, respectively. When a load current LOAD is reduced and a light load condition is formed, a voltage of $V_{TG\_P}$ ($V_{TG\_N}$) is appropriately increased (decreased) to control a quantity of charges shared by the gate capacitance of the power switch and $C_{REC}$.

As the amount of shared charges is reduced, the gate voltage swing of the power transistor is reduced. When a load current is higher than 50 mA, $V_P$ swings 2.2 V to 3.3 V and $V_N$ swings 0 V to 1.1 V.

Thus, the gate voltage swing of the power switch is 1.1 V. When the load current is lower than 10 mA, the gate swing of the power switch is reduced by 50 mV. Generally, the power switch gate voltage has a range of 1.1 V to 900 mV based on the load current condition so that in the light load condition, the switching loss may be minimized.

Another method to reduce the switching loss is to operate at a low switching frequency so that a proposed converter is designed to adjust a switching frequency. FIGS. 6A and 6B illustrate a circuit of an example of a frequency adjustable ramp generator and a waveform change based on a current, respectively.

A bias current $I_{BIAS}$ flows into a cap bank, and a voltage of $V_{RAMP}$ rises. When the voltage of $V_{RAMP}$ rises to $V_H$, a reset signal is generated in an SR latch to turn on an $M_{RESET}$ transistor. When $M_{RESET}$ is turned on, charges of cap bank are discharged so that the voltage of $V_{RAMP}$ drops. When the voltage of $V_{RAMP}$ drops to $V_L$, a reset signal is turned off in the SR latch and the $M_{RESET}$ transistor is turned off.

Therefore, the voltage $V_{RAMP}$ rises again to form a ramp waveform. The frequency is represented by the following Equation 14.

$$f_s \propto \frac{I_{BIAS}}{C_{RAMP}(V_H - V_L)} \quad \text{Equation 14}$$

$C_{RAMP}$ is a total capacitance of cap bank.

The frequency is proportional to $I_{BIAS}$ and reversely proportional to a difference between $C_{RAMP}$ and $V_H$ and $V_L$. The capacitance value of cap bank is increased using CS[3:0] generated in the light load condition.

A frequency change based on the load current is illustrated in FIG. 6B. The frequency is set to 6.5 MHz to 2.8 MHz based on the load current condition. Therefore, the total efficiency is improved by reducing the switching loss.

In order to verify a charge-recycling gate-voltage swing control technique of the gate driver, the technique is compared with the related art. FIG. 7A to 7C illustrate measurement waveforms of power MOSFET gate voltage swing of the proposed circuit based on a load current.

FIG. 7A illustrates an example of a measurement waveform when a load current is 100 mA or higher, FIG. 7B illustrates an example of a measurement waveform when the load current is between 50 mA and 100 mA, and FIG. 7C illustrates an example of a measurement waveform when the load current is 50 mA or lower so that it is understood that the swing width is reduced.

FIG. 8A to 8C illustrate examples of ramp measurement waveforms of the proposed circuit based on the load current. The load current conditions of FIGS. 8A, 8B, and 8C are the same as those of FIG. 7A to 7C and it is understood that the lower the current, the higher the frequency.

FIG. 9 is a measurement result of a gate driving loss of a conventional circuit and an example of a proposed circuit based on a current change. Gate driving losses of the conventional full swing, the conventional low swing, and an example of the proposed circuit based on the condition of the load current are illustrated. It is understood that the gate driving loss of the proposed circuit is smaller than that of the conventional circuit. FIG. 10 illustrates an efficiency measurement result of a conventional full swing, conventional low swing, and an example of a proposed circuit based on a current, depicting that the total efficiency of the proposed circuit is the highest.

In the PWM buck converter of the present disclosure, a charge-recycling variable-swing gate driver may be used to improve an efficiency in a low light load condition of the PWM buck converter, thereby reducing a gate driving loss and improving a light load efficiency.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A pulse width modulation (PWM) buck converter, comprising:
    a first P-type transistor having a drain terminal connected to a first node;
    a first N-type transistor having a drain terminal connected to the first node; and
    a gate driver configured to apply a first gate voltage to a first gate terminal of the first P-type transistor and apply a second gate voltage to a second gate terminal of the first N-type transistor, the gate driver comprising:
        a first buffer configured to generate the first gate voltage applied to the gate terminal of the first P-type transistor;
        a second buffer configured to generate the second gate voltage applied to the gate terminal of the first N-type transistor;
        a capacitor, disposed between the first buffer and the second buffer, configured to accumulate a portion of electrical charges supplied from the first buffer to the first P-type transistor, and supply the accumulated electrical charges to the gate terminal of the first N-type transistor; and
        a transmission gate disposed between a common node of the first and second buffers and the capacitor, and configured to adjust a quantity of charged or discharged electrical charges of the capacitor.

2. The PWM buck converter of claim 1, wherein the capacitor is a recycle capacitor.

3. The PWM buck converter of claim 1, wherein the transmission gate is configured to receive a first transmission gate voltage and a second transmission gate voltage, and voltage levels of the first and second transmission gate voltages are adjusted.

4. The PWM buck converter of claim 3, further comprising:
    a bias selector configured to set and select the first transmission gate voltage and the second transmission gate voltage applied to the transmission gate; and
    a PWM signal generator configured to generate and input a first PWM signal and a second PWM signal to the first buffer and the second buffer, respectively.

5. The PWM buck converter of claim 4, wherein when a voltage of the first PWM signal of the first buffer rises, a first switch and a second switch of the first buffer are turned off and turned on, respectively, and
    wherein a voltage of an internal node of the first buffer drops to turn on and turn off a third switch and a fourth switch of the first buffer, respectively, to turn off a first power switch.

6. The PWM buck converter of claim 4, wherein when a voltage of the second PWM signal of the second buffer rises, a fifth switch and a sixth switch of the second buffer are turned off and turned on, respectively, and
    wherein a voltage of an internal node of the second buffer is shifted to 0 V to turn on and turn off a seventh switch and an eighth switch of the second buffer, respectively, to turn on a second power switch.

7. The PWM buck converter of claim 6, wherein electrical charges stored in the capacitor are recycled to drive the second power switch so that an output of the second buffer raises a voltage of 0 V to a voltage of the common node of the first and second buffers.

8. The PWM buck converter of claim 4, wherein when a voltage of the first PWM signal of the first buffer drops, a first switch and a second switch of the first buffer are turned on and turned off, respectively, and
    wherein a voltage of an internal node of the first buffer rises to turn off and turn on a third switch and a fourth switch of the first buffer, respectively, to turn on a first power switch.

9. The PWM buck converter of claim 4, wherein when a voltage of the second PWM signal of the second buffer drops, a fifth switch and a sixth switch of the second buffer are turned on and turned off, respectively, and
    wherein a voltage of an internal node of the second buffer is increased to turn off and turn on a seventh switch and an eighth switch of the second buffer, respectively, to turn off a second power switch.

10. The PWM buck converter of claim 1, wherein a quantity of charges used for one cycle of the gate driver is $$Q_{total\_prop} = Q_{P\_prop} + Q_{P\_prop} \approx \frac{1}{3} C_{GP} V_{in},$$

wherein $C_{GP}$ is a gate capacitance of the first P-type transistor, Vin is a source voltage of the first P-type transistor.

* * * * *